(12) United States Patent
Augendre et al.

(10) Patent No.: US 9,704,709 B2
(45) Date of Patent: Jul. 11, 2017

(54) METHOD FOR CAUSING TENSILE STRAIN IN A SEMICONDUCTOR FILM

(71) Applicants: Commissariat a L'Energie Atomique et aux Energies Alternatives, Paris (FR); STMicroelectronics (Crolles 2) SAS, Crolles (FR)

(72) Inventors: Emmanuel Augendre, Montbonnot (FR); Aomar Halimaoui, La Terrasse (FR); Sylvain Maitrejean, Grenoble (FR); Shay Reboh, Grenoble (FR)

(73) Assignees: COMMISSARIAT A L'ENERGIE ATOMIQUE ET AUX ENERGIES ALTERNATIVES, Paris (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/260,767

(22) Filed: Sep. 9, 2016

(65) Prior Publication Data

US 2017/0076944 A1 Mar. 16, 2017

(30) Foreign Application Priority Data

Sep. 11, 2015 (FR) ..................................... 15 58482

(51) Int. Cl.
*H01L 21/02* (2006.01)
*H01L 21/265* (2006.01)
(Continued)

(52) U.S. Cl.
CPC .. *H01L 21/02694* (2013.01); *H01L 21/02532* (2013.01); *H01L 21/02592* (2013.01);
(Continued)

(58) Field of Classification Search
CPC ......... H01L 21/02649; H01L 21/02667; H01L 21/26586; H01L 21/266
See application file for complete search history.

(56) References Cited

U.S. PATENT DOCUMENTS

| 8,940,623 B2 | 1/2015 | Gay et al. |
| 2005/0124146 A1 | 6/2005 | Bedell et al. |

(Continued)

FOREIGN PATENT DOCUMENTS

| EP | 2 782 118 A1 | 9/2014 |
| EP | 2 840 594 A2 | 2/2015 |
| WO | WO 2007/064472 A1 | 6/2007 |

OTHER PUBLICATIONS

S. Maitrejean et al. "A New Method to Induce Tensile Stress in Silicon on Insulator Substrate: From Material Analysis to Device Demonstration", ECS Transactions, vol. 66, No. 4, 2015, 10 pages.
(Continued)

*Primary Examiner* — Thanh V Pham
(74) *Attorney, Agent, or Firm* — Oblon, McClelland, Maier & Neustadt, L.L.P.

(57) ABSTRACT

A Method for producing a layer of strained semiconductor material, the method comprising steps for: a) formation on a substrate of a stack comprising a first semiconductor layer based on a first semiconductor material coated with a second semiconductor layer based on a second semiconductor material having a different lattice parameter to that of the first semiconductor material, b) producing on the second semiconductor layer a mask having a symmetry, c) rendering amorphous the first semiconductor layer along with zones of the second semiconductor layer without rendering amorphous one or a plurality of regions of the second semiconductor layer protected by the mask and arranged respectively opposite the masking block(s), d) performing recrystallization of the regions rendered amorphous and the first semiconductor layer resulting in this first semiconductor layer being strained (FIG. 1A).

14 Claims, 3 Drawing Sheets

(51) Int. Cl.
| | |
|---|---|
| H01L 21/266 | (2006.01) |
| H01L 29/10 | (2006.01) |
| H01L 21/8234 | (2006.01) |
| H01L 21/84 | (2006.01) |
| H01L 29/165 | (2006.01) |
| H01L 29/66 | (2006.01) |

(52) U.S. Cl.
CPC ...... *H01L 21/02667* (2013.01); *H01L 21/266* (2013.01); *H01L 21/26586* (2013.01); *H01L 21/823412* (2013.01); *H01L 21/84* (2013.01); *H01L 29/1054* (2013.01); *H01L 29/165* (2013.01); *H01L 29/66568* (2013.01)

(56) References Cited

U.S. PATENT DOCUMENTS

2009/0298301 A1    12/2009   Mantl
2014/0284769 A1     9/2014   Halimaoui et al.

OTHER PUBLICATIONS

P. Grudowski et al. "An Embedded Silicon-Carbon S/D Stressor CMOS Integration on SOI with Enhanced Carbon Incorporation by Laser Spike Annealing", Proceedings of IEEE International SOI Conference, 2007, 2 pages.

S. Flachowsky et al. "Stress Memorization Technique for n-MOSFETs: Where is the Stress Memorized?" Ultimate Integration on Silicon, Mar. 18-19, 2010, 4 pages.

W. Schwarzenbach et al. "Strained Silicon on Insulator Substrates for Fully Depleted Application", IEEE International ICICDT Conference—Paper H., vol. 3, 2012, 4 pages.

French Preliminary Search Report issued Jul. 13, 2016 in French Application 15 58482, filed Sep. 11, 2015 (with English Translation of Categories of Cited Documents).

H.S. Yang et al. "Dual Stress Liner for High Performance sub-45nm Gate Length SOI CMOS Manufacturing", Electron Devices Meeting, 2004, IEDM Technical Digest, 2004, 3 pages.

European Patent Office Action issued Feb. 16, 2017 for Application No. 16188202.2.

European Search Report issued Feb. 2, 2017 for Application No. 16188202.2.

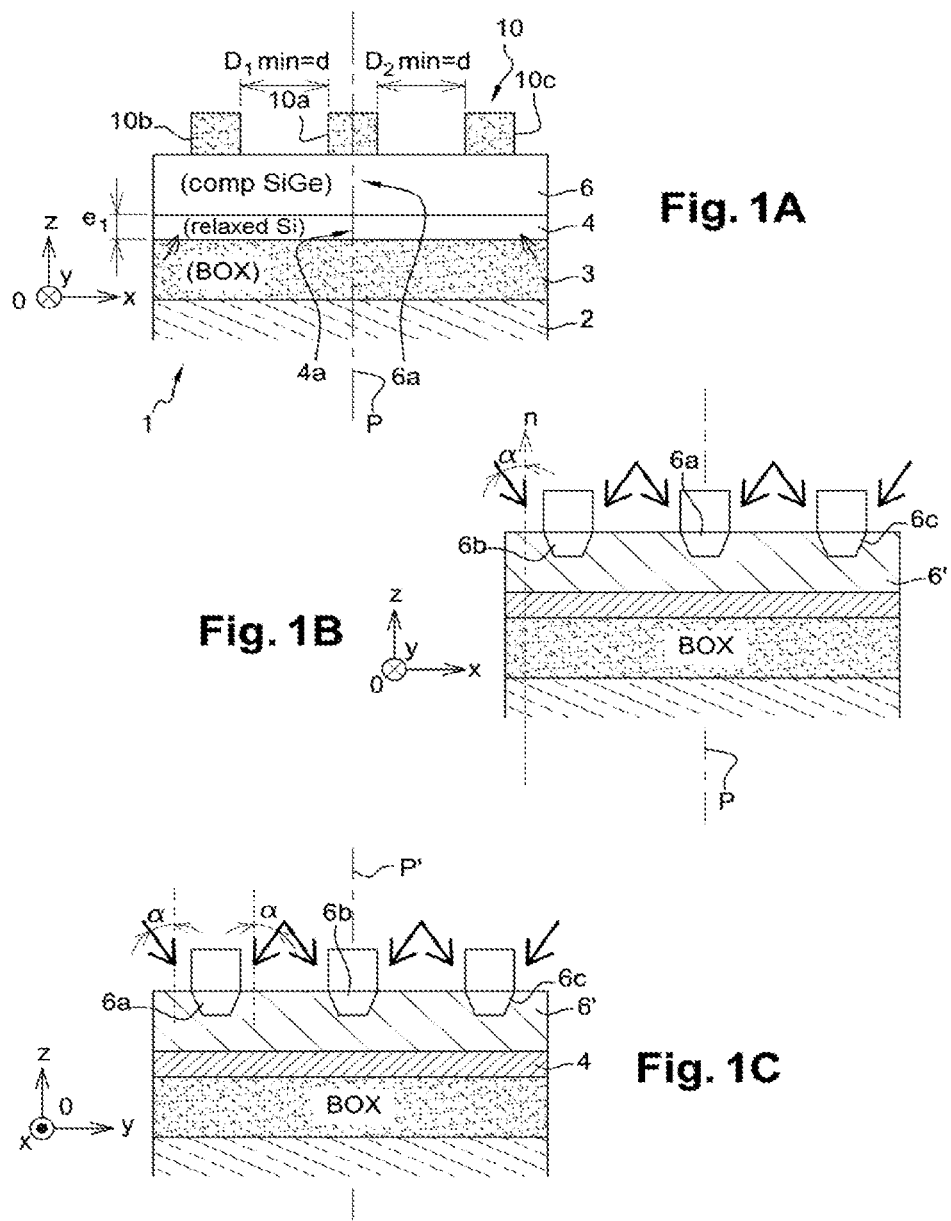

METHOD FOR CAUSING TENSILE STRAIN IN A SEMICONDUCTOR FILM

TECHNICAL FIELD AND PRIOR ART

The present application relates to the field of structures comprising a semiconductor layer having mechanical deformation or stress.

The term mechanical deformation denotes a material which has the crystalline lattice parameter(s) thereof elongated or shortened with respect to a nominal lattice parameter.

In the case whereby the deformed lattice parameter is greater than the so-called "natural" parameter of the crystalline material, the latter is said to be subject to tensile deformation or tension. When the deformed lattice parameter is less than the natural lattice parameter, the material is said to be subject to compressive deformation or compression.

With these states of mechanical deformation, states of mechanical stress are associated. For all that, it is also common to refer to these states of deformation as states of mechanical stress. Hereinafter in the present application, this concept of deformation ("strain" according to the terminology) will be denoted generically by the term "stress".

For some applications, in particular for producing transistors, it may be advantageous to envisage a layer of strained semiconductor material. Indeed, mechanical tensile or compressive stress on a semiconductor layer makes it possible to induce an increase in the velocity of the charge carriers. As such, the performances of transistor devices formed in such a layer are enhanced.

The prior art includes producing strained semiconductor-on-insulator type substrates, i.e. wherein the material of the superficial semiconductor layer is strained, this superficial layer being arranged on an insulating layer, in turn arranged on a generally semiconductor base layer.

The strained superficial semiconductor layer is generally intended to act as an active layer i.e. wherein at least a part of electronic components such as transistors is intended to be formed.

The prior art particularly includes producing sSOI type substrates (sSOI for "strained Silicon-On-Insulator") comprising a tensile strained superficial silicon layer.

One method for producing such a type of substrate may consist firstly of growing epitaxially a compressive strained SiGe-based semiconductor layer on a Si-based semiconductor layer. Then, ion implantation of the Si layer and a lower region of the SiGe layer is performed so as to relax the SiGe. Recrystallisation of the lower region of the SiGe layer and the Si layer is then carried out using an upper region of SiGe layer which has not been rendered amorphous and wherein the crystalline structure has been preserved as the zone of origin of a recrystallisation front. During recrystallisation, SiGe crystal nuclei apply the lattice parameter thereof on the Si layer which is then tensioned.

During the amorphisation of the SiGe which results in the relaxation thereof, a creep phenomenon of the region rendered amorphous may occur. This tends to create discontinuities in the non-amorphous upper region of the SiGe layer wherein the crystalline structure has been preserved. This upper region is then formed of crystalline blocks distributed at random. When recrystallisation is performed, a block rotation phenomenon may give rise to crystalline orientation discontinuities in the recrystallised layers. The strained Si layer obtained after recrystallisation is then inhomogeneous in terms of crystalline orientation.

The problem arises of finding a novel method for producing a structure provided with a layer of strained semiconductor material which is enhanced with respect to the drawbacks given above.

DESCRIPTION OF THE INVENTION

One embodiment of the present invention envisages a method for producing a structure comprising a layer of strained semiconductor material, the method comprising steps for:

a) formation on a substrate of a stack comprising a first semiconductor layer based on a first semiconductor material coated with a second semiconductor layer based on a second semiconductor material having a different lattice parameter to that of the first semiconductor material, b) production on the second semiconductor layer of a mask formed by one or a plurality of blocks, c) inclined implantations with respect to a normal to the main plane of the substrate, so as to render amorphous the first semiconductor layer along with zones of the second semiconductor layer without rendering amorphous one or a plurality of regions of the second semiconductor layer protected by the mask and arranged respectively opposite the block(s) of the mask, d) performing recrystallisation of the regions rendered amorphous and the first semiconductor layer resulting in this first semiconductor layer being strained.

The mask may exhibit symmetry with respect to a plane of symmetry passing through at least one first block of the mask, this plane of symmetry being orthogonal to a main plane of the substrate.

By providing a symmetric distribution of the blocks of the mask, crystallisation without rotation of crystal nuclei is promoted, which makes it possible to apply a strained semiconductor layer having a more homogeneous crystalline structure.

The mask is advantageously formed from a plurality of identical blocks arranged in the plane of symmetry according to a constant distribution interval.

This makes it possible to limit creep phenomena of amorphous zones and thus helps obtain a strained semiconductor material of superior quality.

Advantageously, inclined implantations with respect to the normal to the main plane of the substrate are used, this plane being in turn a plane of symmetry of the mask.

The inclined implantations are preferably symmetrical with respect to this plane of symmetry, i.e. implantations are produced on either side of the plane of symmetry with equal respective angle of inclination values. The symmetrical implantations produced on either side of the plane of symmetry preferably have equal respective energies and doses.

Similarly, the use of such a symmetry helps prevent the rotation of the crystal nuclei.

Advantageously, the first block is arranged facing a first region of the first semiconductor layer wherein a transistor channel is suitable for being produced.

The channel is thus produced in a region removed from the zones wherein the recrystallisation fronts are liable to meet in step d).

The semiconductor layer is preferably rendered amorphous along the entire thickness thereof.

According to one particular embodiment, the first block may have a pattern similar to a transistor gate intended to be produced facing the first region.

The mask may be formed by etching at least one layer via block copolymer-based masking.

According to one particular embodiment, the implantation mask comprises cylinder-shaped blocks wherein the base extends along the second semiconductor layer. This may make it possible to obtain a mask wherein the blocks have a constant distribution interval in a plurality of directions.

According to a further particular embodiment, one or plurality of blocks of the mask have a parallelepiped shape extending parallel with the main plane of the substrate and orthogonally to the plane of symmetry. Such a mask shape may make it possible by amorphisation/recrystallisation to apply a uniaxial strained first semiconductor layer.

The method may further comprise, after recrystallisation, a step for removing the second semiconductor layer.

After removing the second semiconductor layer, the method may comprise the formation of at least one transistor wherein the gate is arranged facing the first region and wherein the channel extends entirely in the first region.

Advantageously, the first semiconductor layer is made of silicon, whereas the second semiconductor layer is made of silicon-germanium.

The second semiconductor layer may exhibit a germanium concentration gradient, the Germanium concentration decreasing gradually on approaching the first layer.

It is advantageously possible to envisage a second layer with high Germanium concentrations, i.e. greater than 20% and particular between 20% and 50% at the face of the second semiconductor layer which may make it possible to strain the first semiconductor layer further when it is made of silicon.

BRIEF DESCRIPTION OF THE FIGURES

The present invention will be understood more clearly on reading the description of examples of embodiments given merely by way of indication and in no way as a limitation, with reference to the appended figures wherein:

FIGS. 1A-1F illustrate an example of a method for producing a first strained semiconductor-on-insulator layer wherein this first layer is rendered amorphous and then recrystallised by applying the lattice parameter of a second semiconductor layer thereto;

Identical, similar or equivalent parts in the various figures bear the same reference numbers for an easier transition from one figure to another.

Figure 1D:
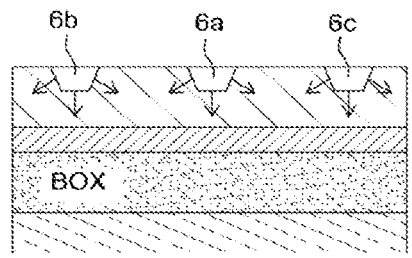

The various parts represented in the figure are not necessarily represented according to a uniform scale, to render the figures more legible.

Moreover, in the description hereinafter, terms such as "lower", "upper" which are dependent on the orientation of the structure are applied considering that the structure is oriented in the manner illustrated in the figures.

DETAILED DESCRIPTION OF PARTICULAR EMBODIMENTS

An example of a method for producing a structure provided with a layer of strained semiconductor material will now be given with reference to FIGS. 1A-1F.

The starting material of the method may be a semiconductor-on-insulator substrate 1, in particular a SOI substrate comprising a semiconductor base layer 2 for example made of Si, coated with an insulating layer 3 referred to as BOX (for "Buried Oxide"), in turn coated with a superficial semiconductor layer 4, for example based on Si, intended to be strained, and referred to hereinafter as the first semiconductor layer.

On the first semiconductor layer 4, a second semiconductor layer 6 based on a semiconductor material having a different lattice parameter to that of the material of the first layer 4 is then grown epitaxially.

When the first semiconductor layer 4 is based on silicon, the second semiconductor layer 6 may be envisaged based on silicon-germanium ($Si_{1-x}Ge_x$ where x for example is between 20 and 50%). In this case, during the epitaxial growth, the silicon-germanium tends to observe the lattice parameter of the silicon resulting in a compressive strained layer of $Si_{1-x}Ge_x$.

Preferably, the thickness $e_1$ of the first semiconductor layer 4 is chosen below a critical thickness of plastic relaxation. This critical thickness is notably dependent on the stress level of the second semiconductor layer 6, this level being in turn dependent notably on the thickness $e_2$ of the second semiconductor layer 6 and the lattice parameter of the constituent material thereof. When the second semiconductor layer 6 is based on $Si_{1-x}Ge_x$, the critical thickness below which the thickness $e_1$ of the superficial semiconductor layer 4 is chosen is dependent on the Germanium concentration of the second semiconductor layer 6. For example, it is possible to envisage a first semiconductor layer 4 made of silicon having a thickness $e_1$ less than 10 nm when the second semiconductor layer 6 is made of $Si_{1-x}Ge_x$ where x is in the region of 0.20.

The thickness $e_2$ of the second semiconductor layer 6 may be greater than $e_1$ and preferably as high as possible while remaining less than a critical thickness of plastic relaxation hc as mentioned for example in the document entitled: "Critical thickness for plastic relaxation of SiGe" by Hartmann et al. Journal of Applied Physics 2011.

For example, when the second semiconductor layer 6 is made of $Si_{1-x}Ge_x$, the thickness thereof may be envisaged in the region of 20 nm.

FIG. 1A represents a step for forming an implantation mask 10 on the second semiconductor layer 6.

This implantation mask 10 is configured to protect certain regions of the second semiconductor layer 6 during a subsequent ion implantation step. The material and the thickness of the implantation mask 10 are adapted according to the implantation condition and in particular the dose, energy, species envisaged for this implantation.

According to one example, an implantation mask 10 is formed by etching a layer of $HfO_2$ having a thickness in the region of 25 nm deposited on a 3 nm layer of $SiO_2$. The layer wherein the block(s) of the mask 10 are produced may be etched according to an $Al_2O_3$ hard mask produced by ALD ("Atomic Layer Deposition") type deposition via openings of block copolymer-based masking. The use of such masking may notably make it possible to produce an implantation mask 10 wherein the blocks have a homogeneous size and are distributed regularly on the second semiconductor layer 6.

The implantation mask 10 may be formed from a plurality of separate blocks 10a, 10b, 10c, with a symmetry of distribution of the blocks 10a, 10b, 10c with respect to at least one given plane P, passing through the second semiconductor layer 6 and through at least one masking block, the given plane P being orthogonal to a main plane of the substrate 1. The term "main plane" of the substrate denotes herein and throughout the description a plane passing through the substrate and which is parallel with the plane [O; x; y] of the orthogonal reference point [O; x; y; z] given in FIG. 1A. In the example in FIG. 1A, the plane P of symmetry is a plane passing through a first masking block 10a and separating two equal portions of this first block 10a.

The blocks 10a, 10b, 10c forming the mask 10 are distributed according to a constant interval in at least one direction parallel with the main plane of the substrate 1. As such, in the example in FIG. 1A, the blocks 10a, 10b, 10c are arranged such that a first minimum distance D1 min between the first block 10a and the second block 10b adjacent to the first block 10a is equal to a minimum distance D2 min between the first block 10a and the third block 10b adjacent to the first block 10a, D1 min, D2 min being equal to d, where d may be for example in the region of 1 to 4 times the length of the blocks 10a, 10b, 10c, this length being measured parallel with the y axis in FIG. 1A.

According to one example of an embodiment, the blocks 10a, 10b, 10c may be envisaged with a length in the region of 1 to 3 times the thickness $e_2$ of the second semiconductor layer 6. This length is measured parallel with the x axis in FIG. 1A.

The blocks 10a, 10b, 10c may also be formed with a width equal or substantially equal to the length thereof. The width of the blocks is herein measured parallel with the y axis in FIG. 1A.

Advantageously, among the blocks 10a, 10b, 10c of the mask 10, at least one block 10a is arranged facing a region 4a of the first semiconductor layer 4 wherein a transistor channel structure is envisaged.

Subsequently, the first semiconductor layer 4 and certain zones 6' of the semiconductor layer 6 which are not protected by the mask 10 are rendered amorphous.

For this, inclined ion implantations are performed, i.e. such that the ion beam creates an angle α different to zero, also referred to as "tilt", with a normal n to the main plane of the substrate 1. Regions 6a, 6b, 6c, of the semiconductor layer 6 arranged below the blocks 10a, 10b, 10c of the mask 10 and protected thereby are not rendered amorphous.

The number of implantations made may be dependent on the shape of the blocks 10a, 10b, 10c of the mask 10. In one case, for example, where the blocks 10a, 10b, 10c have an equal width and length, implantations may be made according to four different quadrants, in other words four different orientations of the ion beam.

FIG. 1B illustrates an embodiment of at least two inclined implantations symmetrical with one another with respect to the given plane P. Symmetrical implantations with respect to the plane P of symmetry are produced on either side of the plane of symmetry preferably with the same angle of inclination and equal respective energies and doses. FIG. 1C illustrates a use of at least two further inclined implantations symmetrically with one another with respect to a further plane P'.

The plane P' is also a plane of symmetry of the mask. The plane P' is this time orthogonal to the main plane of the substrate and to the given plane P. In the example illustrated in FIGS. 1B, 1C, the first layer is rendered amorphous over the entire thickness thereof.

By way of example, in a case where the semiconductor layer 6 is a 20 nm layer of $Si_{1-x}Ge_x$ where x is equal to 20%, whereas the first semiconductor layer 4 is made of Silicon and has a thickness of 10 nm, and the mask 10 made of $HfO_2$ has a thickness in the region of 10 nm, the amorphisation step may be carried out by means of Si implantations, according to a 20° tilt, a dose between 1.5 and $3 \times 10^{14}$ at/cm$^2$ and an energy between 20 and 30 keV.

This amorphisation makes it possible to obtain a relaxation of the regions 6a, 6b, 6c of the semiconductor layer 6. Following the amorphisation, an arrangement of the regions 6a, 6b, 6c is obtained wherein the crystalline structure has been preserved which observes that of the blocks 10a, 10b, 10c of the implantation mask 10.

The implantation mask 10 may then be removed. For example, when this mask 10 is made of W on $SiO_2$, the removal may be carried out using hydrogen peroxide ($H_2O_2$) followed by hydrofluoric acid (HF).

Then, recrystallisation of the first semiconductor layer 4 and the zones 6' rendered amorphous of the superficial layer 6 is performed, using the regions 6a, 6b, 6c wherein the crystalline structure has been preserved as zones of origin of recrystallisation fronts. FIG. 1D gives schematically and using arrows the direction of propagation of the recrystallisation fronts.

Recrystallisation is performed using at least one thermal annealing. By way of example, in a case where the semiconductor layer 6 is a 20 nm layer of $Si_{1-x}Ge_x$ where x is equal to 20%, whereas the first semiconductor layer 4 is made of silicon and has a thickness of 10 nm, an annealing of at least 2 minutes at a temperature in the region of 600° C. may be performed.

During the recrystallisation, the material of the regions 6a, 6b, 6c, for example $Si_{1-x}Ge_x$, applies the lattice parameter thereof to that of the first semiconductor layer 4, which is then strained. When the first semiconductor layer 4 is based on Si, a layer 4 of strained silicon-on-insulator may be obtained.

Due to the arrangement of the crystalline regions 6a, 6b, 6c with respect to the zones rendered amorphous, any crystalline nucleus rotation phenomena are limited which makes it possible to obtain, in the end, a recrystallised semiconductor material of enhanced quality and in particular of more uniform crystalline orientation.

Figure 1E:
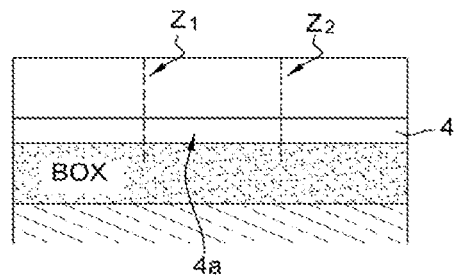

FIG. 1E represents the stack of semiconductor layers 4, 6 once recrystallisation has been performed. In this figure, dotted lines Z1, Z2 correspond to zones where the recrystallisation fronts meet.

A region 4a of the first semiconductor layer 4 wherein a transistor channel region is envisaged is thus as removed as possible from zones where recrystallisation fronts meet, enabling the use of a transistor with enhanced electrical performances.

Subsequently, the second semiconductor layer 6 is removed. This removal may be performed by selective etching with respect to the material of the first semiconductor layer 4.

By way of example, the selective etching of the second semiconductor layer 6 when it is made of $Si_{1-x}Ge_x$ and arranged on a layer 4 of Si may be carried out using a mixture of acetic acid, hydrogen peroxide, and hydrofluoric acid.

Figure 1F:
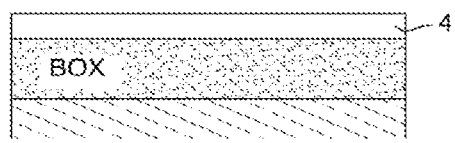

Following this removal, a strained semiconductor-on-insulator type substrate as illustrated in FIG. 1F is obtained, using which a microelectronic device may be produced.

Figure 2:
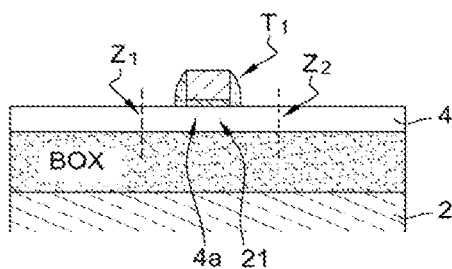
FIG. 2 illustrates the use of a transistor wherein the channel region extends in the strained semiconductor layer and is provided outside zones wherein recrystallisation fronts met during recrystallisation.

FIG. 2 represents a transistor structure T equipped with a channel structure provided in the region 4a of the first semiconductor layer 4 which is the most removed from the zones Z1, Z2 where the recrystallisation fronts meet.

One alternative embodiment of the example of an embodiment described above envisages creating an implantation mask 100 formed in this case from blocks 100a, 100b, 100c having a cylinder shape wherein a base extends parallel to the main plane of the substrate 1.

Figure 3:
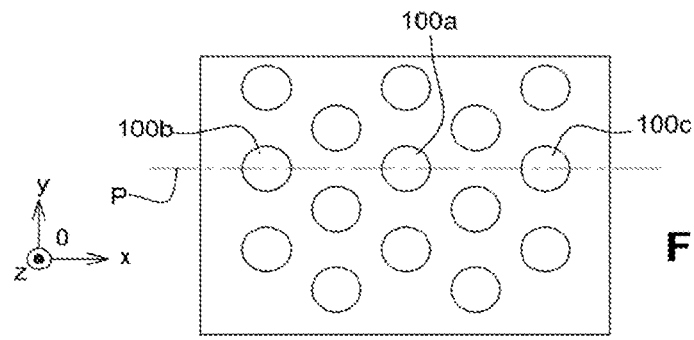
FIG. 3 illustrates an example of an implantation mask having a symmetrical arrangement and formed of cylindrical blocks suitable for protecting certain regions of the second semiconductor layer during amorphisation.

Such a mask 100 is represented in FIG. 3 as a top view.

The mask 100 also has a symmetrical arrangement if considering a plane P of symmetry orthogonal to the main plane of the substrate and passing through at least one block 100a. This mask 100 may be formed by depositing a layer via masking made of a block copolymer material. Such a material is suitable for self-organising into a plane hexagonal lattice of cylinders of substantially circular or polygonal cross-section in a matrix. Such a material makes it possible to obtain satisfactory homogeneity of the masking patterns and distribution according to a constant interval. The masking material may be in particular a diblock copolymer wherein one of the polymers forms cylinders and wherein the other polymer forms a matrix. The diblock copolymer material may be for example one of the following: PS-PMMA (polystyrene-poly(methyl methacrylate)), PS-PVP (polystyrene-polyvinylpyrrolidone), PS-PEO (polystyrene-polyethylene oxide). The step for forming the masking patterns comprises the selective elimination of the cylinders with respect to the matrix. In one case, for example, where the cylinders are based on PMMA in a PS matrix, removal may be carried out using a method comprising immersion in a bath of acetic acid for a period of several minutes, followed by exposure to an argon and oxygen plasma. The mask 100 also has in this example a symmetrical arrangement if considering a further plane P' of symmetry orthogonal to the main plane of the substrate and orthogonal to the plane P.

With such a mask, it is possible to produce symmetrical and inclined amorphisation implantations with respect to the plane P or the plane P'.

A further alternative of the example of an embodiment described above is illustrated in FIGS. 4A-4C. This time, an implantation mask 110 comprising parallelepiped-shaped blocks 110a, 110b, 110c, which extend in the direction of the length thereof, parallel to the main plane of the substrate 1, is produced.

Figure 4A:
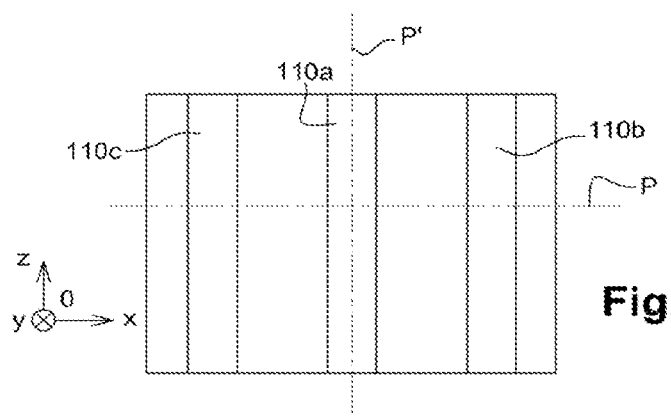
FIGS. 4A-4C illustrate an alternative embodiment of a method wherein the implantation mask has a configuration suitable for creating uniaxial stress in the first semiconductor layer.

Such a mask 110 is represented in FIG. 4A as a top view. The parallelepipedic block mask 110 also has a symmetrical arrangement with respect to a plane P of symmetry orthogonal to the main plane of the substrate and passing through the blocks 110a, 110b, 110c. The blocks 110a, 110b, 110c of the mask are arranged facing regions 4a, 4b, 4c of the first semiconductor layer 4 provided to respectively accommodate transistor channel regions. Advantageously, these blocks 110a, 110b, 110c have a similar pattern to that envisaged for gates 41, 42, 43 of transistors $T_1$, $T_2$, $T_3$ intended to be produced on the regions 4a, 4b, 4c of the first semiconductor layer 4.

As such, in this example, a block 110a of the mask extends facing the whole of the region 4a wherein the channel of the transistor $T_1$ is envisaged.

Figure 4B:
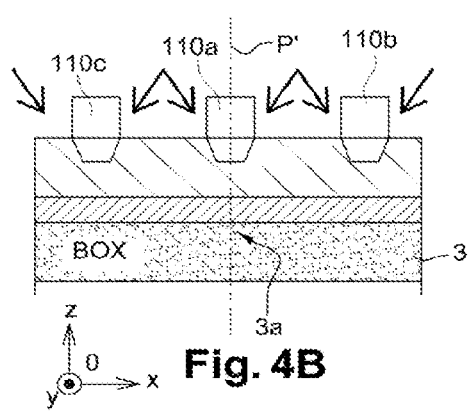

Inclined ion implantations are then performed in order to carry out the amorphisation of the first layer 4 and of zones 6' of the second layer. In this example, the amorphisation may be performed using implantations carried out on two different quadrants, in other words, as illustrated in FIG. 4B, using at least two inclined implantations symmetrical with one another with respect to a plane P'. This plane P' is orthogonal to the main plane of the substrate and to the plane P of symmetry of the mask 110.

After this amorphisation, the recrystallisation steps are performed so as to strain the first semiconductor layer 4. Due to the arrangement of the mask 110 and the shape of these blocks 110a, 110b, 110c, it is possible, following the recrystallisation, to obtain a first semiconductor layer 4 subject to uniaxial strain in direction parallel to the main plane of the substrate and orthogonal to that wherein the blocks 110a, 110b, 110c of the mask 110 extend.

Steps for removing the mask 110, removing the second semiconductor layer 6 are also implemented.

Figure 4C:
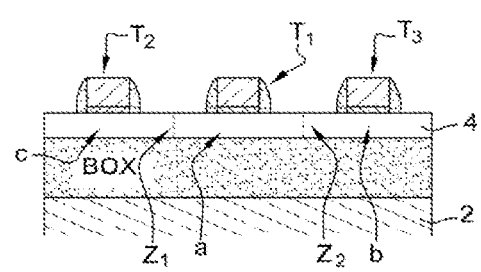

FIG. 4C illustrates the subsequent embodiment of transistors $T_1$, $T_2$, $T_3$ on regions 4a, 4b, 4c of the first semiconductor layer 4 facing which the blocks 100a, 100b, 100c of the mask were arranged. The arrangement of the respective channel regions 4a, 4b, 4c of the transistors $T_1$, $T_2$, $T_3$ is envisaged outside zones where the recrystallisation fronts meet symbolised by the lines Z1, Z2, these zones being in this example situated at the source and drain blocks. As such, degradation of the performances of the channels of the transistors $T_1$, $T_2$, $T_3$ is prevented.

As an alternative embodiment of one or another of the methods described above, it is possible to envisage producing the implantation mask 10 from a strained material, such as tensile strained Silicon nitride, in order to increase the stress transferred during the recrystallisation of the zones 6' and the first semiconductor layer 4.

According to a further alternative embodiment of one or another of the examples described above, a second layer made of $Si_{1-y}Ge_y$ is formed where y varies for example between y=0.20 at the lower face thereof, and y=0.50 at the upper face thereof.

The term "lower" face denotes that in contact with the first semiconductor layer 4, whereas the so-called "upper" face is opposite the lower face.

The second layer made of $Si_{1-y}Ge_y$ thus has a Germanium concentration gradient with a Germanium concentration which increases on moving away from the first semiconductor layer. This may make it possible to preserve crystalline regions having a high Germanium concentration below the blocks of the mask 10 following the amorphisation step. It is then possible to perform recrystallisation using crystal nuclei having a high Germanium concentration in order to obtain increased stress in the first semiconductor layer 4.

A method according to the invention may be applied to other pairs of materials than silicon and silicon-germanium. A different stack of semiconductor layers 4 and 6 may be envisaged. For example, it is possible place a first strained semiconductor layer 4 made of Germanium this time by growing epitaxially a second semiconductor layer 6 made of a material having a higher lattice parameter such as for example $Ge_xSn_{1-x}$.

According to a further example, a first strained semiconductor layer 4 made of $In_yGa_{1-y}As$ may be produced by growing a second semiconductor layer 6 made of $In_zAl_{1-z}As$ (where z>y).

The invention claimed is:

1. A method for producing a structure comprising a layer of strained semiconductor material, the method comprising steps consisting of:
   a) providing on a substrate a stack comprising a first semiconductor layer based on a first semiconductor material coated with a second semiconductor layer based on a second semiconductor material having a different lattice parameter to that of the first semiconductor material,
   b) producing on the second semiconductor layer a mask formed by one or a plurality of separate blocks, the mask being symmetrical with respect to a plane of symmetry, this plane of symmetry being orthogonal to a main plane of the substrate and passing through at least one first block of the mask, c) performing one or a plurality of inclined implantations with respect to a normal to the main plane of the substrate, so as to render amorphous the first semiconductor layer along with zones of the second semiconductor layer without rendering amorphous one or a plurality of regions of the second semiconductor layer protected by the mask and arranged respectively opposite the mask block(s), d) performing recrystallisation of the regions rendered amorphous and the first semiconductor layer resulting in this first semiconductor layer being strained.

2. The method according to claim 1, wherein the inclined implantations are symmetrical with respect to a plane of symmetry of the mask.

3. The method according to claim 1, wherein a first block of the mask is arranged facing a first region of the first semiconductor layer wherein a transistor channel is suitable for being produced.

4. The method according to claim 2, wherein the first block is a transistor gate pattern.

5. The method according to claim 1, wherein the mask is formed from a plurality of identical blocks arranged in the plane of symmetry according to a constant distribution interval.

6. The method according to claim 5, wherein the mask is formed by depositing at least one layer via block copolymer-based masking.

7. The method according to claim 1, wherein at least one block of the mask has a cylinder shape wherein a base extends along the second semiconductor layer.

8. The method according to claim 1, wherein one or a plurality of the blocks of the mask have a parallelepiped shape extending parallel with the main plane of the substrate and orthogonally to the plane of symmetry.

9. The method according to claim 1, further comprising after the recrystallisation step: a step for removing the second semiconductor layer.

10. The method according to claim 9, further comprising, after the step for removing the second semiconductor layer, the formation of a transistor having a gate wherein the gate is arranged facing the first region and wherein the channel extends entirely in the first region.

11. The method according to claim 10, wherein the first semiconductor layer is made of silicon, the second semiconductor layer is made of silicon-germanium.

12. The method according to claim 11, wherein the second semiconductor layer has a germanium concentration gradient.

13. The method according to claim 1, wherein the first semiconductor layer is rendered amorphous over the entire thickness thereof.

14. The method for forming a transistor comprising the use of a method according to claim 1.

* * * * *